United States Patent
Elliott

(10) Patent No.: US 10,594,316 B2
(45) Date of Patent: Mar. 17, 2020

(54) POWER DISTRIBUTION SYSTEM INCLUDING A COMMUTATION DEVICE

(71) Applicant: GE Aviation Systems Limited, Cheltenham (GB)

(72) Inventor: David Alan Elliott, Cheltenham (GB)

(73) Assignee: GE AVIATION SYSTEMS LIMITED, Gloucestrshire (GB)

( * ) Notice: Subject to any disclaimer, the term of this patent is extended or adjusted under 35 U.S.C. 154(b) by 110 days.

(21) Appl. No.: 15/830,554

(22) Filed: Dec. 4, 2017

(65) Prior Publication Data
US 2018/0167066 A1    Jun. 14, 2018

(51) Int. Cl.
| | | |
|---|---|---|
| *H03K 17/687* | (2006.01) | |
| *H02H 3/087* | (2006.01) | |
| *H02J 1/00* | (2006.01) | |
| *H03K 17/60* | (2006.01) | |
| *H02J 7/34* | (2006.01) | |
| *H02J 1/06* | (2006.01) | |

(52) U.S. Cl.
CPC .......... *H03K 17/687* (2013.01); *H02H 3/087* (2013.01); *H02J 1/00* (2013.01); *H02J 1/06* (2013.01); *H02J 7/34* (2013.01); *H03K 17/60* (2013.01)

(58) Field of Classification Search
CPC ...... H03K 17/687; H03K 17/60; H02H 3/087; H02J 1/00; H02J 1/06; H02J 7/34
See application file for complete search history.

(56) References Cited

U.S. PATENT DOCUMENTS

| | | |
|---|---|---|
| 8,861,162 B2 | 10/2014 | Fuller et al. |
| 9,197,056 B2 | 11/2015 | Liu et al. |
| 2008/0143462 A1* | 6/2008 | Belisle ............ H01H 9/542 335/201 |
| 2012/0242153 A1 | 9/2012 | Papastergiou et al. |
| 2013/0278078 A1 | 10/2013 | Ohlsson et al. |
| 2016/0300671 A1 | 10/2016 | Ergin et al. |

FOREIGN PATENT DOCUMENTS

| | | |
|---|---|---|
| DE | 102012017673 A1 | 6/2013 |
| GB | 2540813 A | 2/2017 |
| WO | 2012038101 A1 | 3/2012 |
| WO | 2013093066 A1 | 6/2013 |
| WO | 2014127830 A1 | 8/2014 |

OTHER PUBLICATIONS

Great Britain Search Report issued in connection with corresponding GB application 1620866.2 dated Jun. 8, 2017.

* cited by examiner

*Primary Examiner* — Robert L Deberadinis
(74) *Attorney, Agent, or Firm* — Wood IP LLC

(57) ABSTRACT

There is provided a power distribution system for power delivery to a load. The power distribution system includes a commutation device disposed between the load and a power source. The commutation device includes a solid state power controller (SSPC) disposed in series with a contactor.

16 Claims, 6 Drawing Sheets

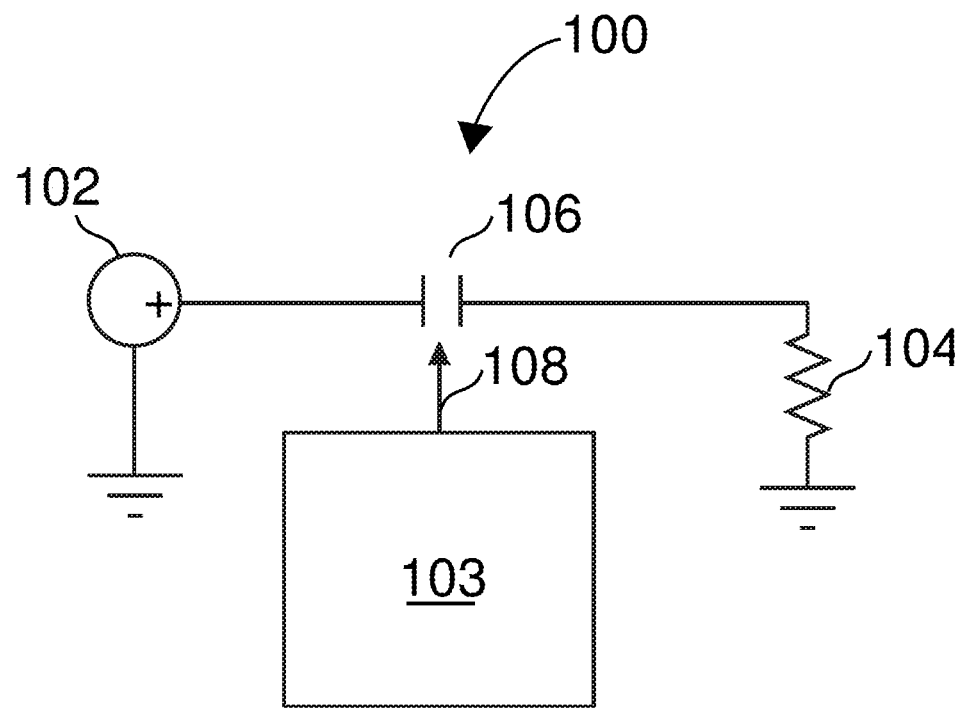
(CONVENTIONAL)
FIG. 1

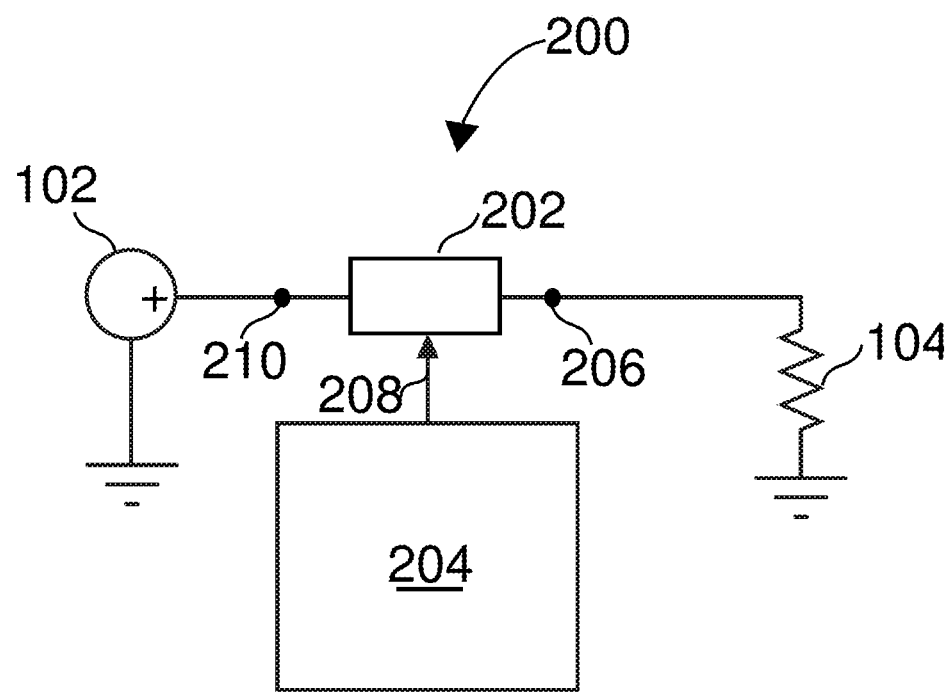
(CONVENTIONAL)
FIG. 2

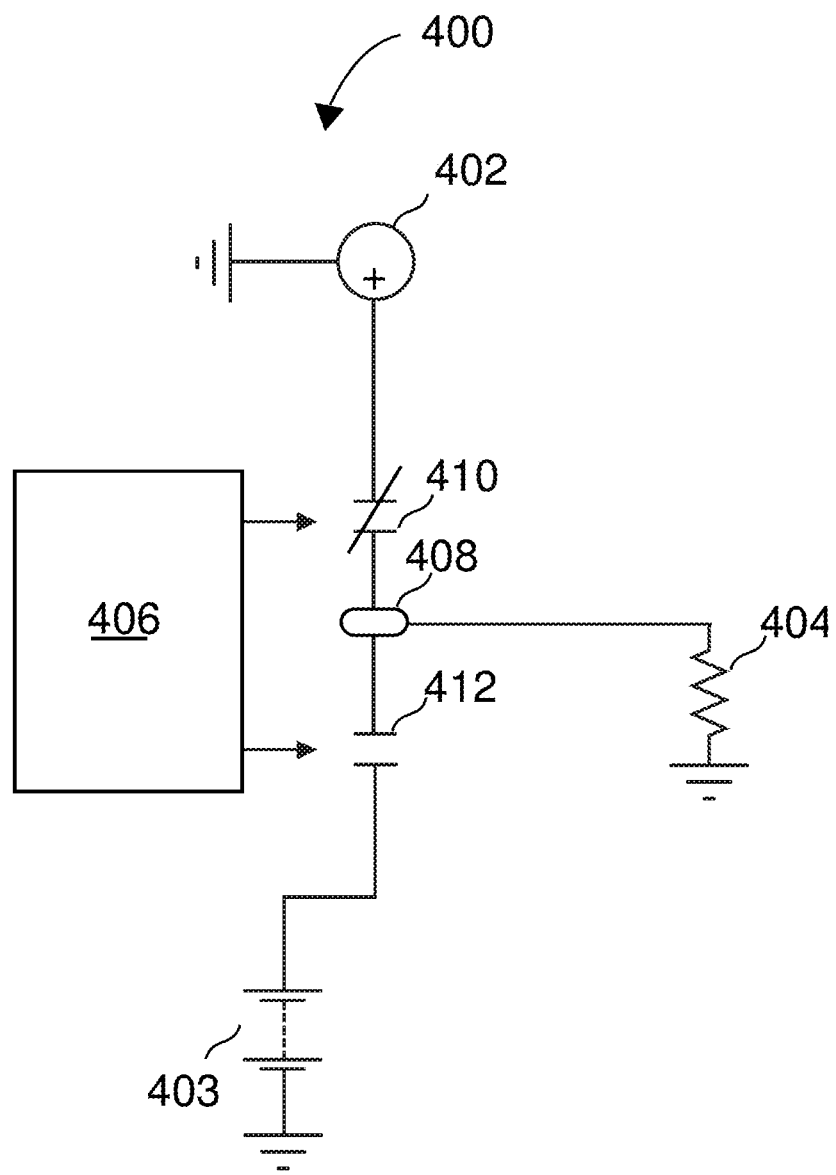
(CONVENTIONAL)
FIG. 4

POWER DISTRIBUTION SYSTEM INCLUDING A COMMUTATION DEVICE

TECHNICAL FIELD

The present disclosure relates to power distribution systems. More particularly, the present disclosure relates to power distribution systems including a commutation device.

BACKGROUND

Electrical power distribution systems select power from one or more sources and distribute power to one or more loads. Each source may be a primary power source or an output of another part of the whole distribution system. Similarly, each load may be a power consuming device (e.g., a heater) or a power input to a stage of the distribution system itself. Thus, the system as whole may include one or more chains of power management devices.

In typical electrical power distribution systems, an electro-mechanical contactor (or relay) is commonly employed as a commutation device. Such a contactor typically has a low resistance to power flow when closed and a high resistance when opened. The latter state effectively prevents current from flowing from a source to a load.

A contactor can have undesirable characteristics, including at least 10 ms of switching time when changing states. Another adverse operational characteristic is when the contactor may fail to open when the current flow is very high, a failure mode that may occur if the contactor connects a low impedance source to a short circuit load.

High current power switching semiconductor devices have been used to mitigate the above-noted issues. When used in lieu of a contactor, these semiconductor devices form what is termed a solid state power controller (SSPC). An SSPC-based commutation device can open or close much faster than its contactor-based counterpart. Moreover, because the rate of change of the current is limited by the intrinsic inductance of the wiring to the load, an SSPC-based commutation device can open to remove power at a convenient and safe overload level before exceeding a maximum current transient level.

There are a number of component technologies (e.g., metal-oxide semiconductor field effect transistor (MOSFET), thyristor, triac, insulated gate bipolar transistor (IGBT)) that can be used for the power switching component(s) of an SSPC, but MOSFETs are typically preferred for low voltage applications (e.g., for voltages lower than 600V) because their voltage drop, and hence power loss, can be made smaller than what is achievable with the alternative component types.

Some configurations of unidirectional MOSFET-based SSPCs can only control current in one direction because a MOSFET includes an intrinsic diode that conducts when the potential difference across the device (from source to drain) is reversed in polarity. Bidirectional current flow control can be achieved by connecting two MOSFETs in series in a back-to-back fashion, so that one of the MOSFETs is able to block the current flow in one direction, while the other MOSFET is able to block the current flow in the opposite direction. However when current flow is enabled, the path impedance will be twice that of the simpler equivalent unidirectional device.

The path impedance can be reduced, and consequently the power loss can be reduced, by paralleling two or more MOSFETs. Moreover, paralleling two or more MOSFETs also enables the total current flow capacity to be increased.

As such, replacing a single unidirectional SSPC with a bidirectional SSPC exhibiting (approximately) the same total power loss requires quadrupling the number of MOSFETs, assuming the majority of the power loss is due to the MOSFET(s), which is typically the case in optimal designs. Unfortunately, the quadrupling requirement for bidirectional control results in a high component count for high current SSPCs, which adversely affects the SSPC's reliability.

SUMMARY

Given the aforementioned deficiencies, a need exists for SSPCs that support bidirectional current flow and reverse current control without appreciably increasing the number of components required to provide such a capability in power distribution systems. The embodiments featured herein help solve or mitigate the above-noted issues as well as other issues known in the art.

One or more of the embodiments described herein provide the capability for bidirectional current routing without significantly increasing the component count in a SSPC. For example, some of the embodiments can include a contactor and a unidirectional SSPC. With suitably coordinated control signals, as shall be described in greater detail below, the SSPC can control the flow of current from a source into the distribution system, including opening rapidly when subjected to a short circuit load. The contactor can be opened when the source's supply is not required, thus ensuring bidirectional isolation and routing. Furthermore, the embodiments provide a rapid switch off mechanism to minimize damage when a severe short circuit in a wiring or load of a power distribution system occurs.

One exemplary embodiment provides a power distribution system for delivering power to a load. The power distribution system includes a SSPC disposed in series with a contactor and a controller module configured to manage power delivery to the load by either turning on or turning off the contactor and the SSPC.

Another exemplary embodiment provides a power distribution system for power delivery to a load. The power distribution system includes a commutation device disposed between the load and a power source. The commutation device includes a SSPC disposed in series with a contactor.

By example, and not limitation, the embodiments can be particularly useful in vehicles such as aircrafts including multiple power sources (e.g., generators and batteries) that are alternately selected to power loads throughout the vehicle. In yet other non-limiting applications, the embodiments can be employed at any point in a power distribution system chain, particularly to link a primary power source to the remainder of a power distribution system. For example, the embodiments can be employed to enable a load to be supplied by one of several alternate power sources, while ensuring that power cannot flow between the power sources.

Moreover, while the switching elements herein are described as MOSFETs, one of skill in the art will readily recognize that other switching devices can also be used. By example, and not by limitation, switching devices in the embodiments can include thrysistors, BJTs, IGBTs, or triacs. The switching devices in the embodiments can generally include solid-state switching devices, including specific arrangement of solid-state switching devices. For example, the switching devices can include GaN transistors that are packaged in a cascode arrangement.

Additional features, modes of operations, advantages, and other aspects of various embodiments are described below with reference to the accompanying drawings. It is noted that the present disclosure is not limited to the specific embodiments described herein. These embodiments are presented for illustrative purposes only. Additional embodiments, or modifications of the embodiments disclosed, will be readily apparent to persons skilled in the relevant art(s) based on the teachings provided.

BRIEF DESCRIPTION OF THE DRAWINGS

Illustrative embodiments may take form in various components and arrangements of components. Illustrative embodiments are shown in the accompanying drawings, throughout which like reference numerals may indicate corresponding or similar parts in the various drawings. The drawings are only for purposes of illustrating the embodiments and are not to be construed as limiting the disclosure. Given the following enabling description of the drawings, the novel aspects of the present disclosure should become evident to a person of ordinary skill in the relevant art(s).

FIG. 1 illustrates a conventional power distribution system in accordance with several aspects described herein.

FIG. 2 illustrates a conventional power distribution system in accordance with several aspects described herein.

FIG. 4 illustrates a conventional power distribution system in accordance with several aspects described herein.

DETAILED DESCRIPTION

Figure 3A:
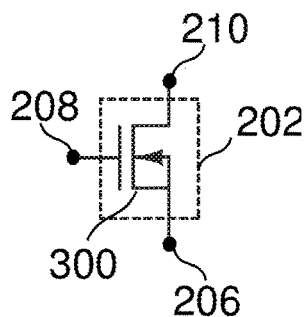
FIG. 3A illustrates a switching element module in accordance with several aspects described herein.

While the illustrative embodiments are described herein for particular applications, it should be understood that the present disclosure is not limited thereto. Those skilled in the art and with access to the teachings provided herein will recognize additional applications, modifications, and embodiments within the scope thereof and additional fields in which the present disclosure would be of significant utility.

FIG. 1 illustrates a conventional power distribution system 100 that interfaces with a DC power source 102 that delivers power to a load 104. The system 100 further includes a contactor control module 103 that drives a contactor 106 via a port 108. During operation, the module 103 may either open or close the contactor 106 to either impede or allow DC power delivery to the load 104.

The module 103 may include hardware and/or software modules that provide, other than the capability to control the contactor 106, functions such as current flow sensing and overcurrent protection for the wiring to the load 104. Furthermore, in some implementations, the module 103 may also provide remote switching and status reporting for higher level system monitoring and decision purposes.

FIG. 2 illustrates another conventional power distribution system 200 that is functionally equivalent to the system 100 but that utilizes a solid state switching element module 202 instead of the contactor 106. The module 202 can include one or more solid state switching elements, e.g., one or more MOSFETs. The system 100 further includes an SSPC gate control module 204 that interfaces directly with the module 202 via a port 208. The module 204 can generate control signals that effectively impede or allow power transfer from a port 210 of the module 210 to a port 206; in other words, the module 204 can control the module 204 to commute power between the source 102 and the load 204. Furthermore, the module 204 may provide overcurrent protection similarly to the module 103 as well as remote switching and status reporting capabilities.

FIGS. 3A, 3B, and 3C, and 3D illustrate several possible configurations for the module 202. For example, in FIG. 3A, the module 202 can include a single switching element, like a MOSFET 300, for example.

Although when the module 204 is configured as shown in FIG. 3A the system 200 has the same functionality as that of the system 100, the two systems have different operating characteristics. For example, the two systems differ in their response speed: in the system 100 the contactor 106 typically requires 10-20 ms to open or close while in the system 200, the MOSFET 300 may be able to change states within 1 microsecond. Thus, as a result of the SSPC, the system 200 can respond directly to changes of current flow to the load 104. The rate of change of current flow to the load 104 can usually be determined by the intrinsic wiring inductance.

Another difference is the degree of isolation between the two systems. In the system 100, the contactor 106 provides a gap when open. The gap prevents current flow in both directions. By contrast, in the system 200, the leakage current through the MOSFET 300, when it is in the open state, can be sufficient to require precautions to eliminate concerns like personnel safety.

Yet another difference is the resistance to reverse current flow in both systems. In the system 100, the contactor 106 inhibits current flow in both directions when it is open whereas in the system 200, the intrinsic diode of the MOSFET 300 will conduct if the potential difference from its drain to its source becomes positive.

Figure 3B:
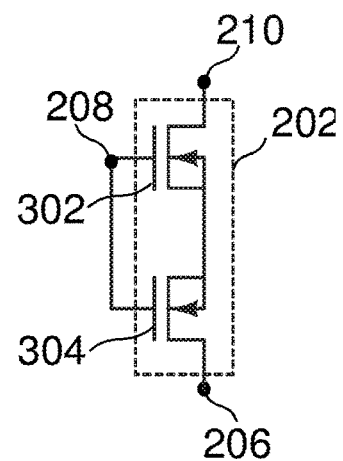
FIG. 3B illustrates a switching element module in accordance with several aspects described herein.

In FIG. 3B, the module 202 includes an SSPC that comprises two back-to-back MOSFETs (302 and 304), which provide bidirectional current routing capability. When the SSPC is in the closed state, the gate drive to both MOSFETs causes the respective channels of each MOSFET to conduct. Thus, the total resistance from the DC power source 102 to the load 104 is twice the drain to source resistance of one of the MOSFETs.

Figure 3C:
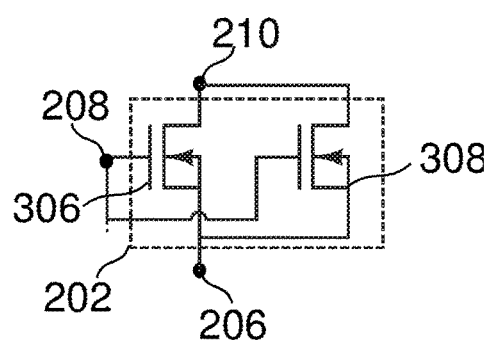
FIG. 3C illustrates a switching element module in accordance with several aspects described herein.

In FIG. 3C, the module 202 includes an SSPC that features the paralleling of two MOSFETs (306 and 308). This arrangement reduces the ON resistance and hence the voltage drop across the SSPC, as well as power dissipation in the closed state. It is noted that SSPCs that are intended as replacements for high current contactors may require many (e.g. tens or even hundreds) of MOSFETs in parallel to provide performance characteristics comparable to that of a contactor. As such, the configurations of FIGS. 3A-3B are shown for illustration purposes, but can, in an actual implementation, include more MOSFETs than those shown.

Figure 3D:
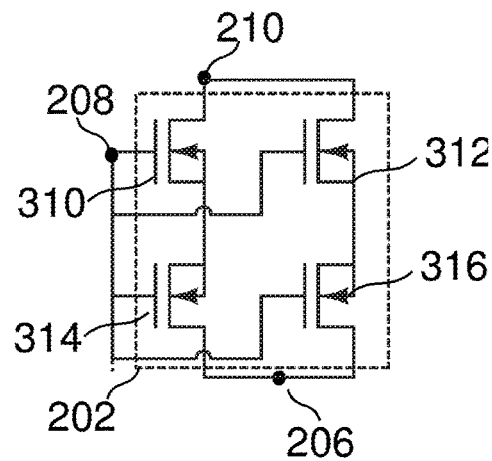
FIG. 3D illustrates a switching element module in accordance with several aspects described herein.

FIG. 3D shows another possible configuration of the module 202. Unlike in FIG. 3A, assuming that the SSPC of FIG. 3D uses identical components, the SSPC of FIG. 3D can control reverse current flow. Thus, in terms of the number of MOSFETs needed, the bidirectional SSPC requires four times as many MOSFETS as its unidirectional counterpart (FIG. 3A).

As noted previously, direct replacement of a high current contactor with a unidirectional SSPC may require many MOSFETs. As such, with respect to the configuration shown in FIG. 3D, this problem is even more accentuated because the quantity of MOSFETs must be quadrupled to obtain a bidirectional SSPC equivalent to a unidirectional SSPC.

Excluding momentary transient conditions that can be handled by known means such as transient voltage suppressors, simple loads like a resistive heater are unlikely to experience reverse current flow. Thus, power flow can be controlled by a unidirectional SSPC. However, FIG. 4 illustrates a conventional power distribution system 400 in which bidirectional switching capability is needed.

In the system 400, a load 404 can be powered from either one of two power sources, i.e., from the DC power source 402 or the battery 403. The system 400 further includes a contactor module 406 that is arranged to ensure that a maximum of one of the two contactors 410 and 412 is closed at any given time. Since the contactors 410 and 412 are intrinsically bidirectional, there can be no power flow from one source to the other.

The system 400 exhibits several issues. For example, if one (or more) of the power sources (402 or 403) has a very low source impedance, and consequently can deliver a very high current under fault conditions such as a short circuit load, then its associated contactor may not open sufficiently quickly to prevent damage. Furthermore, the overload current may prevent the associated contactor from opening, thereby allowing a fault current to flow indefinitely.

If the contactors 410 and 412 were replaced by SSPCs, to ensure that no power transfer from one source to the other source can occur, bidirectional SSPCs would be needed to replace the contactors. However, as stated above, the number of MOSFETs required for a bidirectional SSPC capable of replacing a high current contactor implies that the resulting SSPC could have a greater volume, weight, and cost than the contactor it is designed to replace.

Figure 5:
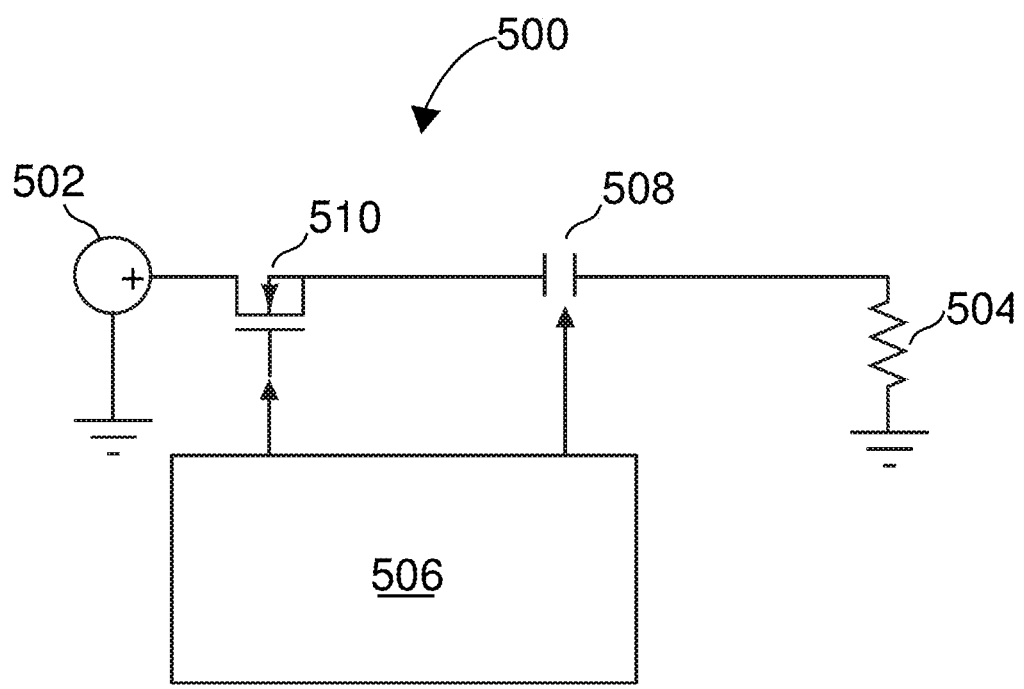
FIG. 5 illustrates a power distribution system in accordance with several aspects described herein.

FIG. 5 illustrates a power distribution system 500 according to an embodiment that mitigate the issues discussed with respect to the system 400. The system 500 includes a unidirectional SSPC (MOSFET 510) and a contactor 508 disposed in series, which together with a coordinated controller form a solid state and contactor power controller (SS&CPC) module 506. The MOSFET 510 can be one switching element (as shown) or it can be more MOSFETs connected in parallel as shown in FIG. 3C. Since the power flow is through the MOSFET 510 and the contactor 508 disposed in series, their relative positions in the chain may be swapped in some alternate embodiments.

When either or both of the MOSFET 510 and the contactor 508 are open, there is no current flow from the source 502 to the load 504 (ignoring transients due to stray inductance and MOSFET leakage currents when the contactor 508 is closed). When the MOSFET 510 and the contactor 508 are both closed, current is able to flow from the source 502 to the load 504.

In one embodiment, the module 506 drives the MOSFET 510 and the contactor 508 with the same command (open or close) at all times. Further, to reduce contact wear and arcing at the contactor 508, when the module 506 commands it to close, the module 506 can initially command only the contactor 508 to close, leaving the MOSFET 510 open. When the contactor 508 contacts have been closed, after a hold time for allowing any mechanical contact bounce, the MOSFET 510 can be closed, thus allowing power flow to the load 504.

The above-noted sequence of operations can be repeated in reverse order to open the path and thus impede current flow. Specifically, the MOSFET 510 is opened first, breaking the circuit between the source 502 and the load 504. For a short period, the intrinsic inductance of the wiring will maintain a current flow that must be handled in the manner usually employed with an SSPC. When the current flow due to stray inductance has decayed to a low level, the contactor 508 is commanded to open, ensuring that power flow in either direction is not possible.

Commanding the MOSFET 510 to open can result in an almost instantaneous response from the MOSFET 510. Thus, if the load 504 short circuits while or prior to when the MOSFET 510 and the contactor 508 are closed, when the short circuit loop is completed, the current flow may progressively increase at a rate mainly determined by the stray inductance of the circuit until the MOSFET 510 is commanded to open. Thus, the MOSFET 510 can act in a timely manner to protect itself, the contactor 508, the source 502, and the load 504 as well as its wiring from consequent damage.

Figure 6:
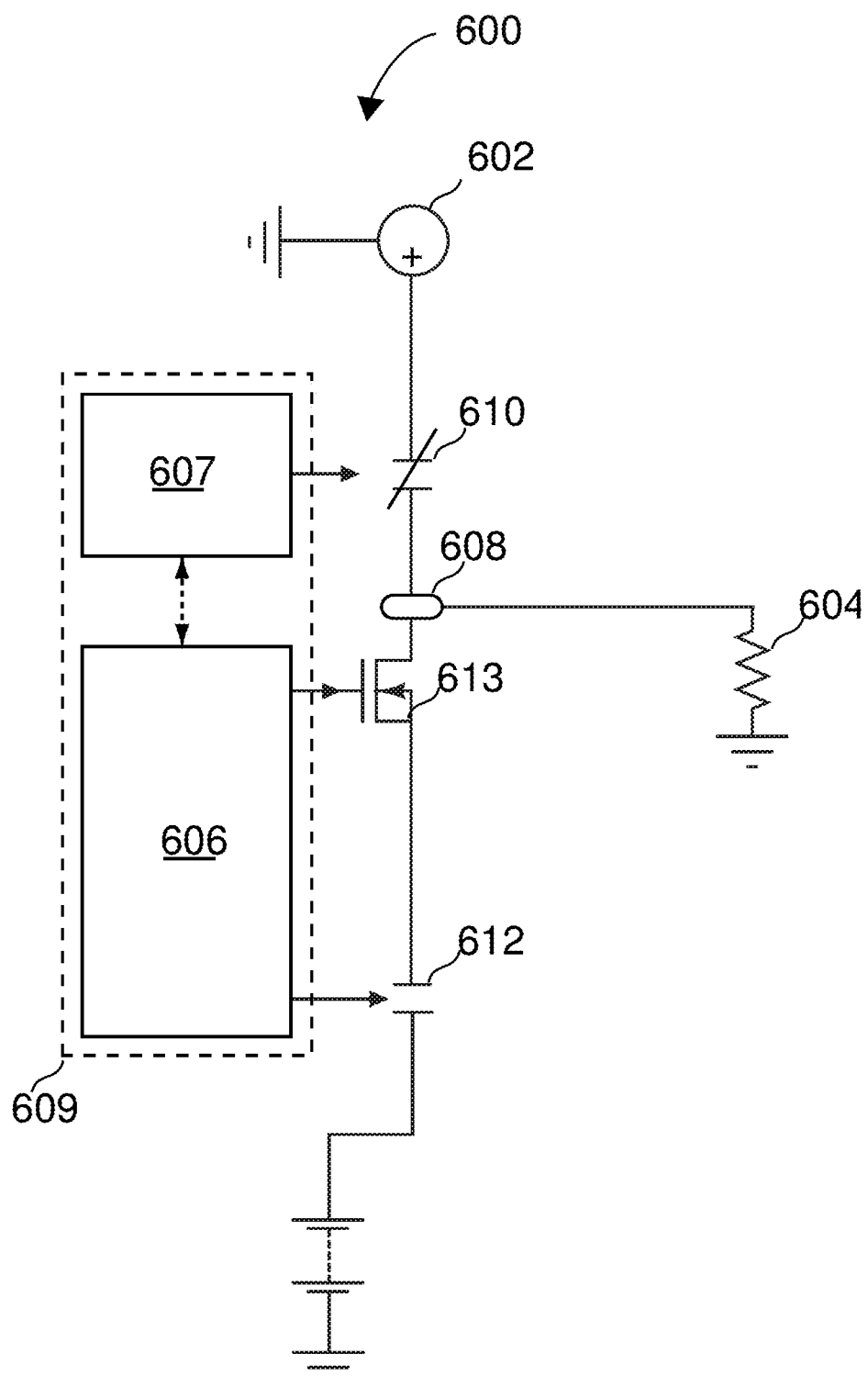
FIG. 6 illustrates a power distribution system in accordance with several aspects described herein.

FIG. 6 illustrates a power distribution system 600 according to another embodiment. The system 600 includes a DC power source 602 and a battery 603 that each can deliver power to a load 604 via a DC bus 608. The system 600 further includes an SS&CP module 609 that interfaces with a MOSFET 613, a contactor 610, and a contactor 612. The module 609 is a commutation device that commutes power from each of the two sources to the load 604. The module 609 includes a solid state power controller 606 and a contactor controller 607, which when taken together, provide the SS&CP function.

During an example operational scenario, the source 602 can be the principal power source for the load 104. Thus, the contactor 610 will be closed when the contactor 612 opens. This configuration prevents power transfer between the source 602 and the battery 603.

If the wiring to the load 604 develops a short circuit, the contactor 610 is instructed by the controller 607 to open, which will prevent damage or hazardous conditions in the circuit. The output characteristics of the source 602 ensure that the contactor 610 can react in a sufficiently timely manner to protect the wiring. Furthermore, should the contactor 610 fail to open, the de-excitation of the source 602 will limit any potential damage.

When the source 602 is not available, the load 604 may be supplied by the battery 603 by ensuring the contactor 610 is open, and closing the MOSFET 613 and the contactor 612. In this situation, the load 104 develops a short circuit, and the MOSFET 613 will promptly open to prevent damage. The contactor 612 will also open to ensure that the battery 603 is isolated.

The embodiments are advantageous for situations in which current flow may rapidly rise to a level above the breaking capability of a contactor and where very high current flows may cause severe damage to the vehicle structure housing the power distribution system and to other vehicle systems.

Unlike in applications utilizing only sources with independent control mechanisms such as a generator with controlled excitation, many power distribution systems are required to connect to sources such as a battery which do not include a secondary mechanism to interrupt the current if a primary contactor fails to open. The embodiments, by including at least one switching element and a contactor in series, circumvent this issue and provide two circuit break points for which the degree of independence depends upon an SS&CP control module. Moreover, the embodiments provide a physical gap in the circuit (with the contactor) when switched off, which can be advantageous in some applications.

Those skilled in the relevant art(s) will appreciate that various adaptations and modifications of the embodiments described above can be configured without departing from the scope and spirit of the disclosure. Therefore, it is to be understood that, within the scope of the appended claims, the disclosure may be practiced other than as specifically described herein.

What is claimed is:

1. A power distribution system for delivering power to a load, comprising:
   a solid state power controller (SSPC) disposed in series with a contactor;
   a first source and a second source, wherein the first source is a direct current (DC) power source and wherein the second source is a battery; and
   a controller module configured to manage power delivery to the load by either turning on or turning off the contactor and the SSPC.

2. The power distribution system of claim 1, wherein the SSPC includes a switching element.

3. The power distribution system of claim 2, wherein the switching element is selected from the group consisting of a metal-oxide semiconductor field effect transistor (MOSFET), a thrysistor, a bipolar junction transistor (BJT), an insulated gate bipolar junction transistor (IGBT), and a triac.

4. The power distribution system of claim 1, wherein the SSPC includes a parallel combination of MOSFETS.

5. The power distribution system of claim 4, wherein the parallel combination of MOSFETs is disposed in series with the contactor.

6. The power distribution system of claim 1, further comprising another contactor disposed in series with the SSPC and the contactor.

7. The power distribution of claim 6, further comprising a contactor control module configured to control the other contactor.

8. The power distribution system of claim 6, further comprising a DC bus for routing power from one of the first source and the second source to the load.

9. A power distribution system for delivering power to a load, comprising:
   a commutation device disposed between the load and a power source, the commutation device including a solid state power controller (SSPC) disposed in series with a contactor;
   a first source; and
   a second source, wherein the first source is a direct current (DC) power source and wherein the second source is a battery.

10. The power distribution system of claim 9, further including a control module configured to switch the commutation device on or off.

11. The power distribution system of claim 9, wherein the commutation device is configured to provide bidirectional current routing.

12. The power distribution system of claim 9, wherein the SSPC includes a switching element.

13. The power distribution system of claim 12, wherein the switching element is selected from the group consisting of a metal-oxide semiconductor field effect transistor (MOSFET), a thrysistor, a bipolar junction transistor (BJT), an insulated gate bipolar junction transistor (IGBT), and a triac.

14. The power distribution system of claim 9, wherein the SSPC includes a parallel combination of MOSFETs.

15. The power distribution system of claim 9, further comprising another contactor.

16. The power distribution system of claim 15, further comprising a contactor control module configured to control the other contactor.

* * * * *